(12) United States Patent
Dooley et al.

(10) Patent No.: US 8,350,417 B1
(45) Date of Patent: Jan. 8, 2013

(54) METHOD AND APPARATUS FOR MONITORING ENERGY CONSUMPTION OF A CUSTOMER STRUCTURE

(75) Inventors: Michael J. Dooley, Sunnyvale, CA (US); Mark Mrohs, Northridge, CA (US)

(73) Assignee: SunPower Corporation, San Jose, CA (US)

( * ) Notice: Subject to any disclaimer, the term of this patent is extended or adjusted under 35 U.S.C. 154(b) by 63 days.

(21) Appl. No.: 13/097,705

(22) Filed: Apr. 29, 2011

Related U.S. Application Data

(63) Continuation of application No. 11/699,934, filed on Jan. 30, 2007, now abandoned.

(51) Int. Cl.
*H01H 9/54* (2006.01)

(52) U.S. Cl. .......... 307/140; 700/297; 700/298

(58) Field of Classification Search .......... None
See application file for complete search history.

(56) References Cited

U.S. PATENT DOCUMENTS

| | | | |
|---|---|---|---|
| 4,321,418 A | 3/1982 | Dran et al. | |
| 4,927,770 A | 5/1990 | Swanson | |
| 5,011,544 A | 4/1991 | Gaddy et al. | |
| 5,053,083 A | 10/1991 | Sinton | |
| 5,100,808 A | 3/1992 | Glenn | |
| 5,101,191 A | 3/1992 | MacFadyen et al. | |
| 5,164,019 A | 11/1992 | Sinton | |
| 5,185,042 A | 2/1993 | Ferguson | |
| 5,270,658 A * | 12/1993 | Epstein | 324/424 |
| 5,360,990 A | 11/1994 | Swanson | |
| 5,369,291 A | 11/1994 | Swanson | |
| 5,468,652 A | 11/1995 | Gee | |
| 5,660,646 A | 8/1997 | Kataoka et al. | |
| 5,859,596 A * | 1/1999 | McRae | 340/870.02 |
| 5,972,732 A | 10/1999 | Gee et al. | |
| 6,037,758 A * | 3/2000 | Perez | 323/268 |
| 6,274,402 B1 | 8/2001 | Verlinden et al. | |
| 6,313,395 B1 | 11/2001 | Crane et al. | |
| 6,315,575 B1 | 11/2001 | Kajimoto | |
| 6,333,457 B1 | 12/2001 | Mulligan et al. | |

(Continued)

FOREIGN PATENT DOCUMENTS

| | | |
|---|---|---|
| JP | 06339236 A | 12/1994 |
| KR | 2007044419 A | 4/2007 |

OTHER PUBLICATIONS

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

(Continued)

*Primary Examiner* — Hal Kaplan
(74) *Attorney, Agent, or Firm* — Okamoto & Benedicto LLP

(57) ABSTRACT

In one embodiment, an improved circuit breaker module is installed in an electrical panel of a customer structure that receives power from a solar cell module and a utility company. The circuit breaker module may include a current sensor for sensing electrical current drawn by the customer structure from the utility company. The circuit breaker module may further include a current processing unit for capturing sensed electrical current values to generate energy consumption data and a data transmitter for transmitting energy consumption data to a remotely located data collection computer. The circuit breaker module may transmit energy consumption data over a wired or wireless data link. The circuit breaker module advantageously allows for relatively low cost and easy installation, encouraging installation of solar cell modules even in existing customer structures.

15 Claims, 5 Drawing Sheets

U.S. PATENT DOCUMENTS

| | | | |
|---|---|---|---|
| 6,337,283 | B1 | 1/2002 | Verlinden et al. |
| 6,387,726 | B1 | 5/2002 | Verlinden et al. |
| 6,423,568 | B1 | 7/2002 | Verlinden et al. |
| 6,424,119 | B1 | 7/2002 | Nelson et al. |
| 6,704,181 | B2 | 3/2004 | Saksa |
| 7,148,774 | B1 | 12/2006 | Shea et al. |
| 7,151,329 | B2 | 12/2006 | Andarawis et al. |
| 7,154,361 | B2 | 12/2006 | Babu et al. |
| 7,161,105 | B2 | 1/2007 | Sabisch |
| 2002/0059952 | A1 | 5/2002 | Shimada |
| 2002/0101695 | A1 | 8/2002 | Saksa |
| 2003/0029036 | A1 | 2/2003 | Gerson |
| 2004/0010350 | A1 | 1/2004 | Lof et al. |
| 2004/0040593 | A1 | 3/2004 | Ho et al. |
| 2005/0001486 | A1* | 1/2005 | Schripsema et al. ............ 307/80 |
| 2006/0052905 | A1* | 3/2006 | Pfingsten et al. ............. 700/286 |
| 2006/0085167 | A1 | 4/2006 | Warfield et al. |
| 2007/0188954 | A1 | 8/2007 | Wiese et al. |

OTHER PUBLICATIONS

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

* cited by examiner

METHOD AND APPARATUS FOR MONITORING ENERGY CONSUMPTION OF A CUSTOMER STRUCTURE

CROSS-REFERENCE TO RELATED APPLICATION

The present application is a continuation of U.S. application Ser. No. 11/699,934, filed on Jan. 30, 2007, which is incorporated herein by reference in its entirety.

BACKGROUND OF THE INVENTION

1. Field of the Invention

The present invention relates generally to electrical power generation and distribution, and more particularly but not exclusively to methods and apparatus for monitoring energy consumption.

2. Description of the Background Art

A solar cell module comprises a plurality of solar cells configured to collect solar radiation for conversion to electrical energy. As the price of oil and the need for renewable power sources continue to increase, so too is the demand for solar cell modules. Solar cell modules may be installed as an additional power source in a customer structure, which may be residential or commercial. For example, a residential home with solar cell modules may continue to receive power from a utility company. For accounting, cost analysis, energy conservation improvement, or other reasons, it is advantageous for the customer (the home owner in this example) to determine how much energy he is receiving from the utility company compared to the solar cell modules. This determination is part of the customer's energy balance, which is the relation between energy consumption and generation. Some solar cell module vendors, such as Sunpower Corporation of San Jose, Calif., incorporate in their solar cell modules mechanisms for readily determining the amount of energy generated by the solar cell module. However, the amount of energy drawn from the utility company is not so easily determined. Although utility companies provide utility meters for manually reading the amount of energy consumed by the customer, utility companies generally do not provide an interface for third parties to electronically access information from the utility meters. This makes it difficult for solar cell module installers, who are essentially in competition with the utility companies, to calculate the customer's energy balance.

SUMMARY

In one embodiment, an improved circuit breaker module is installed in an electrical panel of a customer structure that receives power from a solar cell module and a utility company. The circuit breaker module may include a current sensor for sensing electrical current drawn by the customer structure from the utility company. The circuit breaker module may further include a current processing unit for capturing sensed electrical current values to generate energy consumption data and a data transmitter for transmitting energy consumption data to a remotely located data collection computer. The circuit breaker module may transmit energy consumption data over a wired or wireless data link. The circuit breaker module advantageously allows for relatively low cost and easy installation, encouraging installation of solar cell modules even in existing customer structures.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

A solar cell module installer may install inductive current sensors between a customer structure's main circuit breaker and the utility company's meter ("utility meter") to determine how much power the installation is drawing from the utility company compared to the solar cell module. While workable, this practice is costly and typically does not comply with any industry standard. The relatively high cost involved in the custom installation of these inductive current sensors further discourages monitoring of energy consumption of particular sections (e.g., the kitchen as opposed to the entire home) of the customer structure. This is especially true in retrofits of relatively old structures. Worse, the custom installation may also involve interfering or tampering with lines or equipment owned by the utility company, which may or may not be cooperative with the installer (usually a third party to the utility company). To encourage use of solar cells as a viable renewable power source, it is important to lower the costs associated with energy consumption monitoring without having to rely on the utility company or use or interfere with its equipment.

Figure 1A:
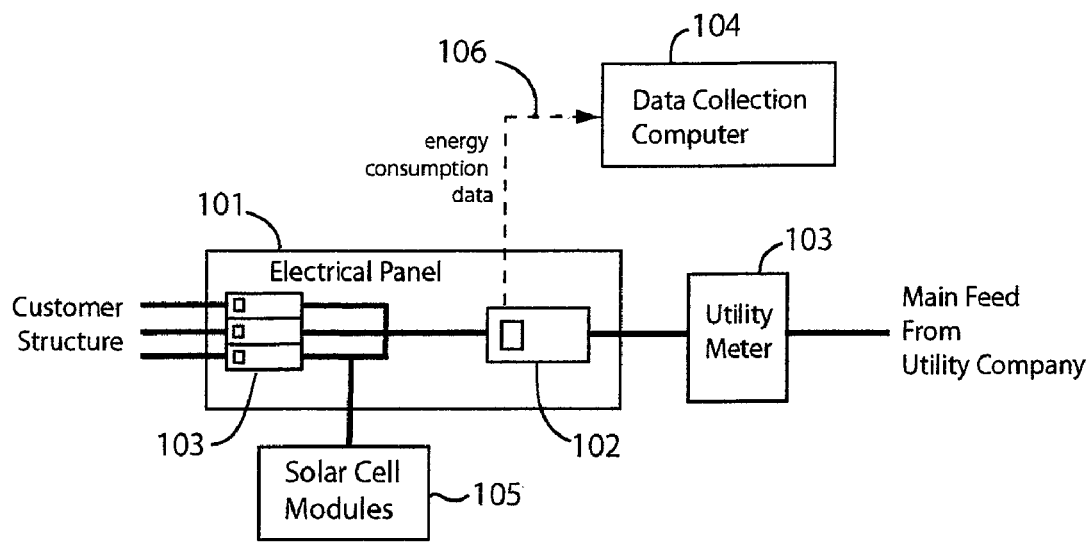
FIGS. 1A and 1B show schematic diagrams of solar cell module installations in accordance with embodiments of the present invention.

Referring now to FIG. 1A, there is shown a schematic diagram of a solar cell module installation in accordance with an embodiment of the present invention. In the example of FIG. 1A, a customer structure (e.g., residential or commercial structure) receives power from the utility company through a utility meter 103. Power from the utility company is fed to an electrical panel 101 first to a circuit breaker module 102 and then further distributed by way of subsidiary circuit breakers 103. In the example of FIG. 1A, the circuit breaker module 102 is configured as the main circuit breaker and accordingly is configured to have a higher current rating (e.g., about 200 amps) compared to the subsidiary circuit breakers 103 (e.g., about 15 amps each). Each subsidiary circuit breaker 103 feeds a particular section of the customer structure. For example, one subsidiary circuit breaker 103 may feed the kitchen, another subsidiary circuit breaker 103 may feed the living room, and so on.

In the example of FIG. 1A, the customer structure also employs solar cell modules 105 as another power source. The solar cell modules 105 may be installed on the rooftop of the customer structure, for example. The solar cell modules 105 may tap to one or more of the lines going to the subsidiary circuit breakers 103 to provide power to the customer structure or to the power distribution grid (i.e., back through the utility meter), depending on whether the solar cell modules 105 are providing insufficient or excess energy.

To determine the amount of energy drawn from the utility company, the circuit breaker module 102 may include current sensing, processing, and data transmission capabilities to detect, process, and transmit energy consumption data to a data collection computer 104 (see dashed arrow 106). The data collection computer 104 may be remotely located relative to the circuit breaker module 102, and may be located nearby or in the customer structure, for example. The data collection computer 104 may be a personal computer, a laptop, a handheld, or other type of computing device. The data collection computer 104 may be configured with a wired or wireless data link to the circuit breaker module 102 to receive energy consumption data from the circuit breaker module 102. The energy consumption data may be indicative of an amount of electrical current supplied to the customer structure by the utility company along with a time stamp on when the electrical current measurement was performed. The data collection computer 104 may include software for receiving and storing energy consumption data for subsequent viewing and analysis. For example, an engineer may use the data collection computer 104 to view and analyze collected energy consumption data collected by the circuit breaker module 102 to calculate the energy balance of the customer structure.

The use of a circuit breaker module 102 to monitor energy consumption and transmit energy consumption data has several advantages. First, circuit breakers are not only readily accessible but also not owned by the utility company. This allows the installer or the customer to easily replace an existing circuit breaker with a circuit breaker module 102. Second, as will be more apparent below, features of the circuit breaker module 102 may be incorporated into existing circuit breaker designs. Circuit breaker companies (e.g., Square-D, Siemens Murray, or General Electric) may thus produce circuit breaker modules 102 that provide backward compatibility with existing electrical panel offerings, limiting the number of stock keeping units (SKU) that have to be developed. Third, because circuit breakers are fairly standardized and produced in mass quantities, the cost of manufacturing circuit breaker modules 102 will be kept reasonably low. This is especially true considering the continued lowering of the cost and size of electronic processing devices that may be incorporated in a circuit breaker module 102.

Figure 1B:
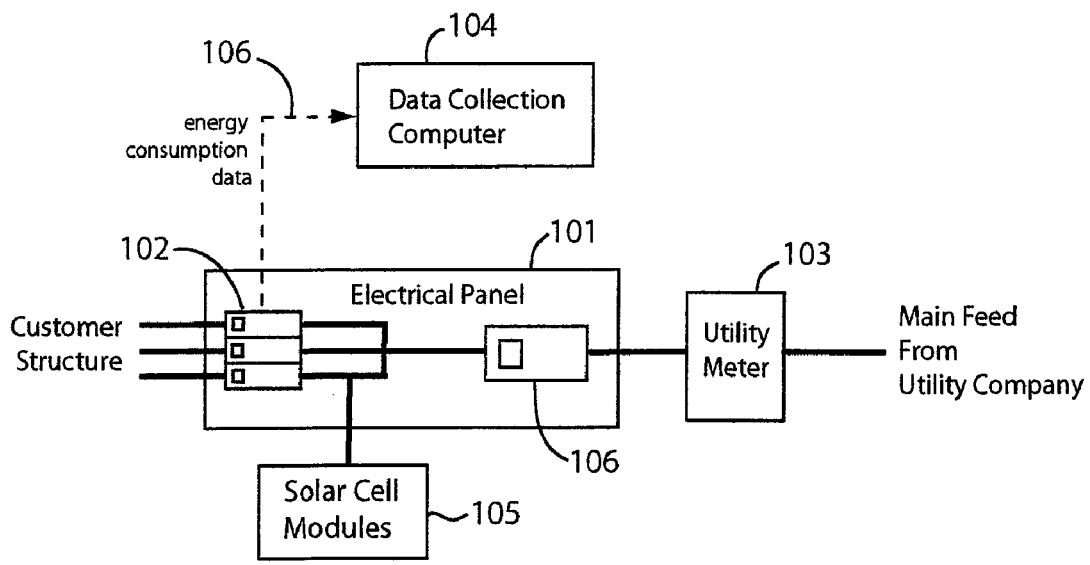

FIG. 1B shows a schematic diagram of a solar cell module installation in accordance with another embodiment of the present invention. The installation of FIG. 1B is similar to that of FIG. 1A except for the use of circuit breaker modules 102 as subsidiary, rather than main, circuit breakers. The relatively low cost and ease of installation of circuit breaker modules 102 allow them to be used for monitoring energy consumption of different, individual sections of the customer structure. The functions of the other components shown in FIG. 1B are otherwise the same as in FIG. 1A.

Figure 2:
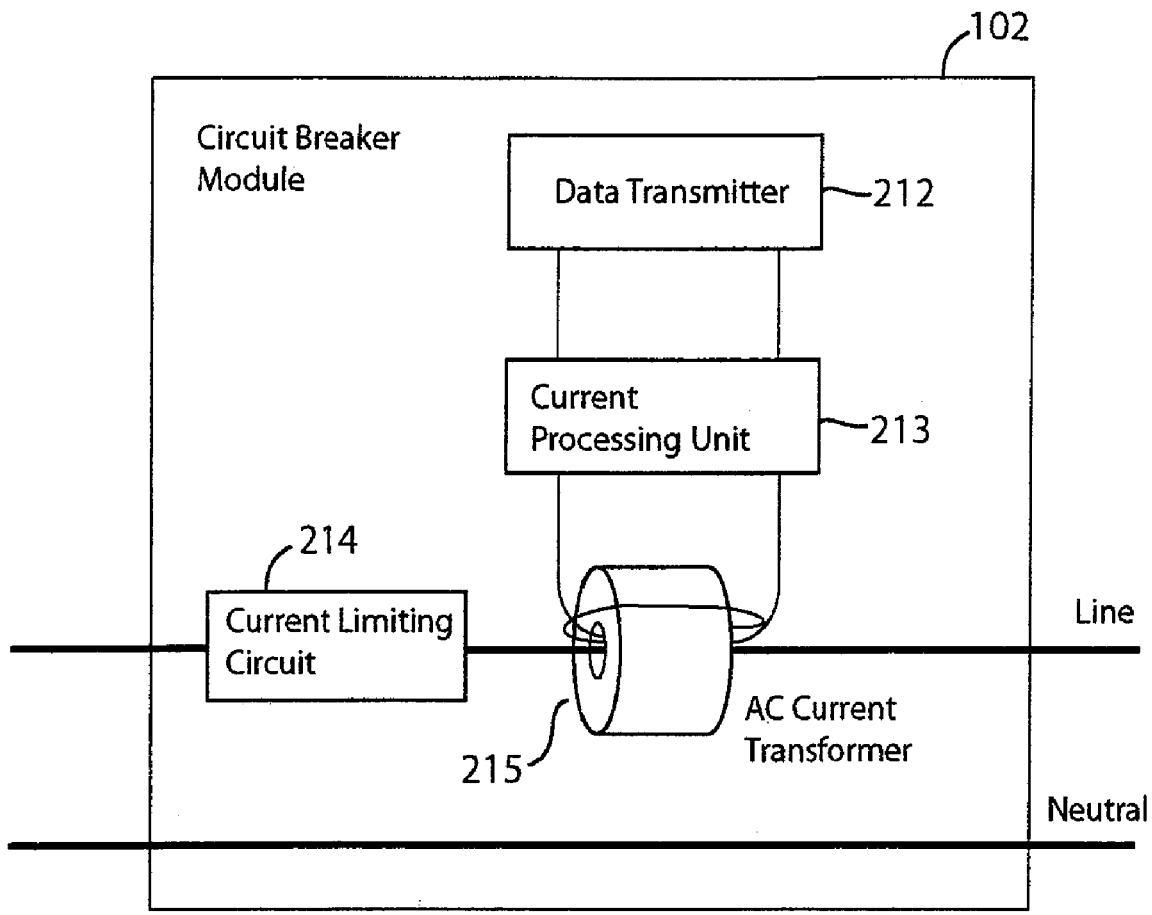
FIG. 2 shows a schematic diagram of a circuit breaker module in accordance with an embodiment of the present invention.

FIG. 2 shows a schematic diagram of a circuit breaker module 102 in accordance with an embodiment of the present invention. In the example of FIG. 2, the circuit breaker module 102 includes a current limiting circuit 214, a current sensor in the form of an AC current transformer 215, a current processing unit 213, and a data transmitter 212. All of the aforementioned components are preferably integrated in the same housing of the circuit breaker module 102 to allow for ease of installation. For example, a conventional circuit breaker may be replaced with a circuit breaker module 102 to allow for energy consumption data collection without having to install additional external components, perform custom installations, or interfere with equipment owned by the utility company.

In one embodiment, the current limiting circuit 214 comprises conventional circuit breaker circuitry, such as a resettable switch controlled by a current fault detector (not shown). In operation, the current fault detector monitors electrical current flowing through the circuit breaker module 102 and trips the switch to break the circuit to the customer installation to stop the current flow when the current exceeds a predetermined value. This is in accordance with conventional circuit breaker operation.

In one embodiment, the transformer 215 senses electrical current flowing through an AC power line. The current processing unit 213 captures (e.g., by storing) the sensed electrical current to determine the amount of electrical current flowing through the circuit breaker module 102 at that time. That is, the current processing unit 213 measures the amount of current flowing through the circuit breaker module 102 using the transformer 215 as the current sensor. The current processing unit 213 may be configured to automatically periodically measure the current flowing through the circuit breaker module 102, and thus the energy consumption of the customer structure. Measured electrical current values may be time stamped and transmitted to the data collection computer 104 (see FIGS. 1A and 1B) as energy consumption data by way of the data transmitter 212. The data transmitter 212 may be configured to send the energy consumption data to the data collection computer 104.

Figure 3:
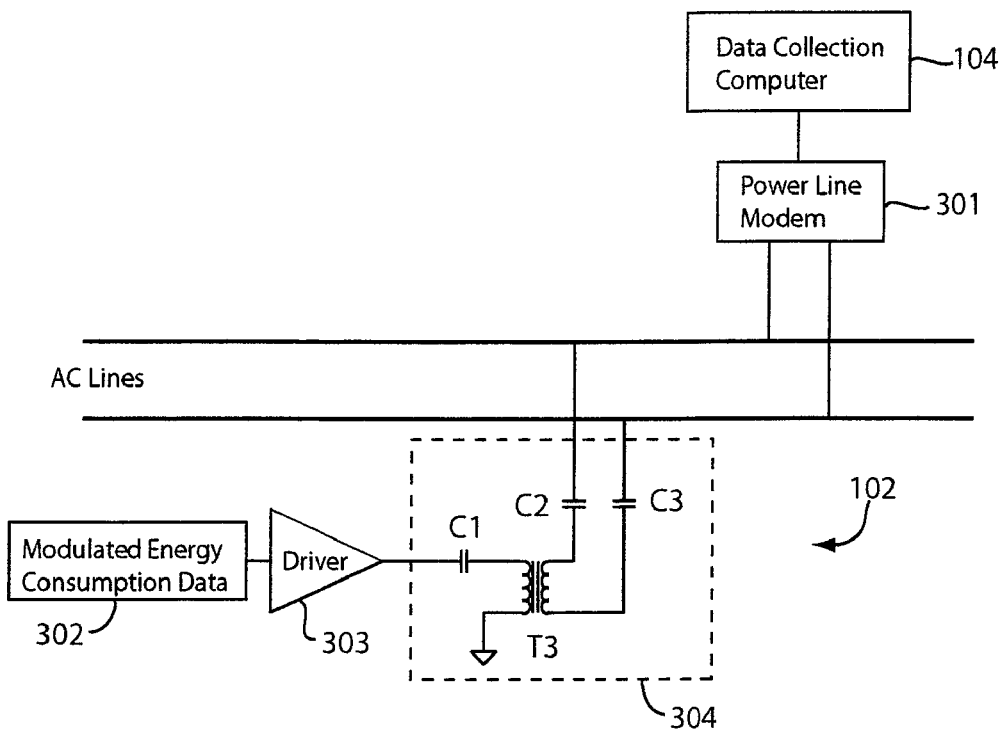
FIG. 3 shows a schematic diagram illustrating transmission of energy consumption data from a circuit breaker module to a remotely located data collection computer using a wired data link, in accordance with an embodiment of the present invention.

FIG. 3 shows a schematic diagram illustrating transmission of energy consumption data from the circuit breaker module 102 to the data collection computer 104 using a wired data link, in accordance with an embodiment of the present invention. In the example of FIG. 3, modulated energy consumption data (labeled as 302) is coupled to the AC power lines by way of a line driver 303 and a transformer circuit 304. The transformer circuit 304 isolates the electronic processing components of the circuit breaker module 102 from the AC power lines. The transformer circuit 304 may comprise an isolation transformer T3 and capacitors C1, C2, and C3. The capacitors C1, C2, and C3 block DC currents while allowing modulated energy consumption data to pass. The line driver 303 and the transformer circuit 304 may be part of a power line modem that also modulates the energy consumption data. Another matching power line modem 301 receives the modulated energy consumption data off the AC power line, demodulates the modulated energy consumption data, and provides the energy consumption data to the data collection computer 104.

Figure 4:
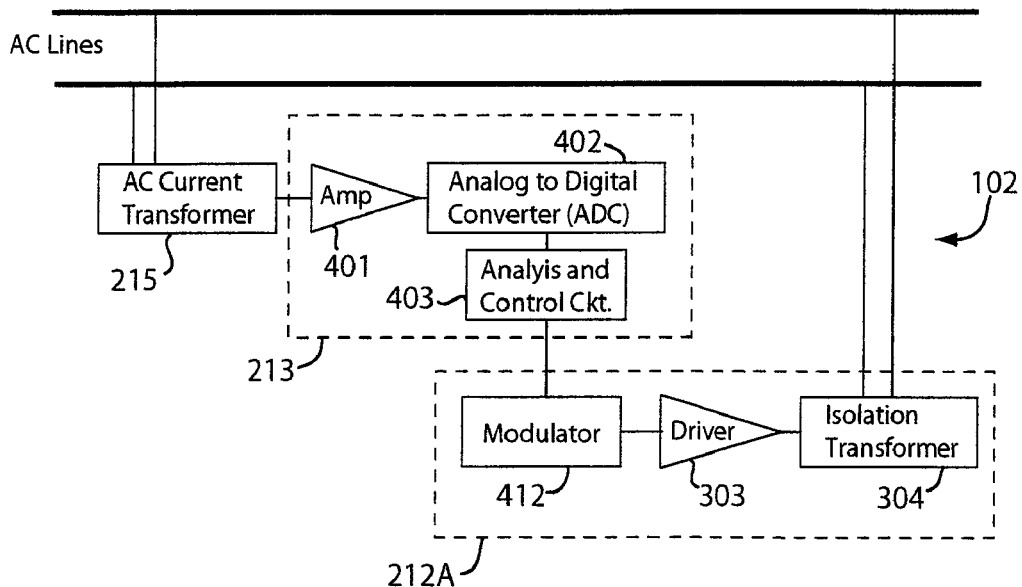
FIG. 4 shows a schematic diagram showing further details of the embodiment of FIG. 3.

FIG. 4 shows a schematic diagram showing further details of the embodiment of FIG. 3. In the example of FIG. 4, the transformer 215 senses electrical current flowing through the circuit module 102. An amplifier 401 amplifies the sensed electrical current for conversion to digital form by the analog to digital converter 402. An analysis and control circuit 403 is configured to periodically read digitized sensed electrical current flowing through the circuit breaker module 102, to time stamp the digitized sensed electrical current, and to store the digitized sensed electrical current along with its time stamp as energy consumption data. As can be appreciated, the digitized sensed electrical current is a measure of the value of the electrical current flowing through the circuit breaker module 102 at a time indicated by the corresponding time stamp. The analysis and control circuit 403 may comprise a programmed microprocessor or microcontroller with supporting logic circuits, for example. The analysis and control circuit 403 may provide the energy consumption data to a data transmitter 212A, which is a particular embodiment of the data transmitter 212 shown in FIG. 2.

In the example of FIG. 4, the data transmitter 212A comprises a power line modem. The power line modem may include a modulator, the line driver 303, and the transformer circuit 304 (see also FIG. 3). The modulator 412 modulates energy consumption data from the analysis and control circuit 403 for transmission to the data collection computer 104 by way of the line driver 303 and the transformer circuit 304.

Figure 5:
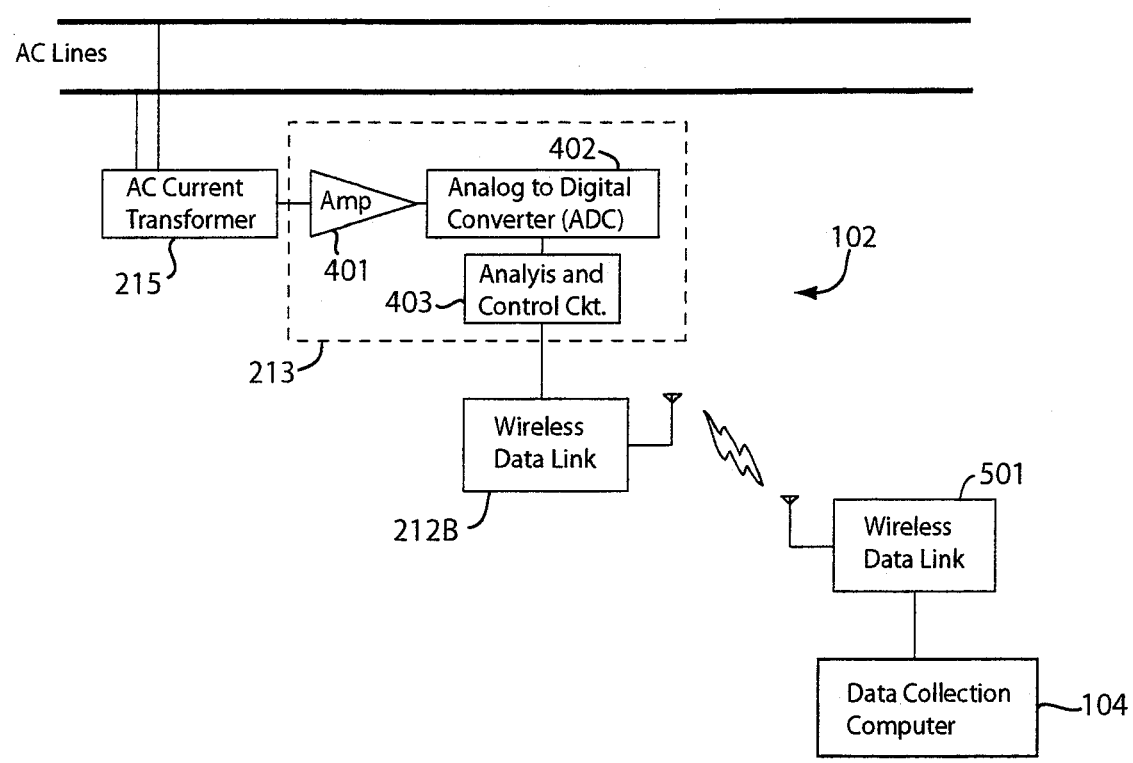
FIG. 5 shows a schematic diagram illustrating transmission of energy consumption data from a circuit breaker module to a remotely located data collection computer using a wireless data link, in accordance with an embodiment of the present invention.

FIG. 5 shows a schematic diagram illustrating transmission of energy consumption data from the circuit breaker module 102 to the data collection computer 104 using a wireless data link, in accordance with an embodiment of the present invention. The circuit breaker modules 102 of FIGS. 5 and 4 are the same except for the use of a data transmitter 212B in FIG. 5. The data transmitter 212B is a particular embodiment of the data transmitter 212 shown in FIG. 2.

In the example of FIG. 5, the data transmitter 212B comprises a wireless data link. For example, the data transmitter 212B may comprise a wireless USB module, such as those available from Cypress Semiconductor of San Jose, Calif. Other wireless data links, such as radios or RF links, may also be used without detracting from the merits of the present invention. In operation, the data transmitter 212B receives energy consumption data from the analysis and control circuit 403, modulates the energy consumption data, and then wirelessly transmits the modulated energy consumption data to a matching wireless data link 501 coupled to the data collection computer 104. The wireless data link 501 demodulates the modulated energy consumption data and passes it to the data collection computer 104, where collected energy consumption data are analyzed to calculate the energy balance of the customer structure.

Figure 6:
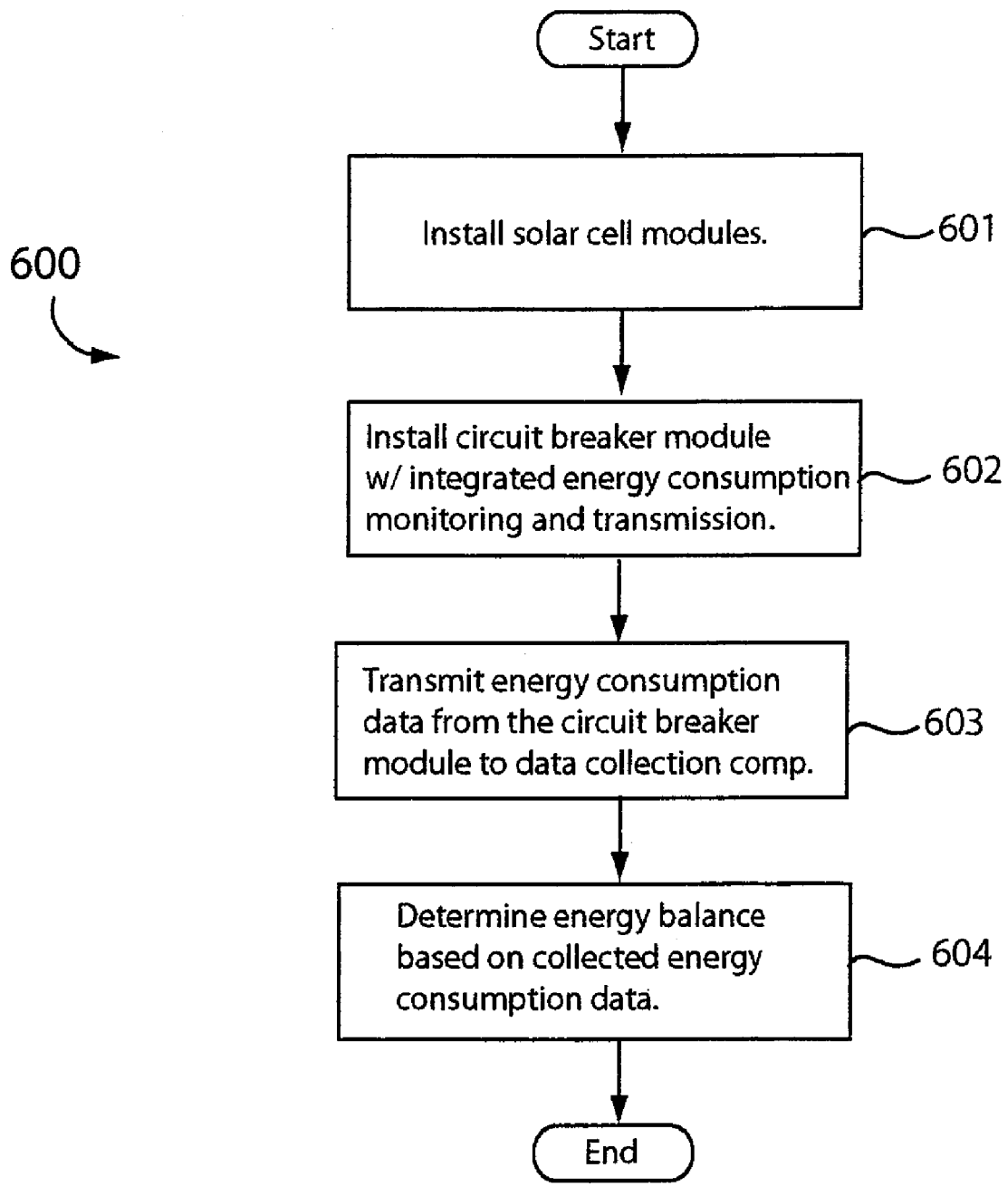
FIG. 6 shows a flow diagram of a method of monitoring energy consumption of a customer structure in accordance with an embodiment of the present invention.

FIG. 6 shows a flow diagram of a method of monitoring energy consumption of a customer structure in accordance with an embodiment of the present invention. In step 601, solar cell modules are installed in a customer structure, such as a residential or commercial structure. The solar cell modules may serve as an additional power source in the customer structure, which also receives power from a utility company.

In step 602, one or more circuit breaker modules with integrated energy consumption monitoring and transmission (e.g., circuit breaker modules 102) are installed in an electrical panel of the customer structure. The circuit breaker modules may replace one or more existing circuit breakers in the electrical panel, for example. In one embodiment, the circuit breaker module is installed as a main circuit breaker to determine energy consumption of the entire customer structure (e.g., see FIG. 1A). In other embodiments, one or more circuit breaker modules are employed as subsidiary circuit breakers to determine energy consumption of individual sections of the customer structure (e.g., see FIG. 1B). The circuit breaker modules allow for monitoring of electrical current drawn from the utility company. The monitored electrical current may be recorded and time stamped by the circuit breaker modules as energy consumption data.

In step 603, energy consumption data are transmitted from the circuit breaker modules to a data collection computer. The energy consumption data may be transmitted from the circuit breaker modules to the data collection computer via a wired (e.g., see FIG. 4) or wireless (e.g., see FIG. 5) data link.

In step 604, energy balance of the customer structure is determined based on collected energy consumption data. Data indicative of the amount of energy drawn by the customer structure from the solar cell modules may be gathered from the solar cell modules. The amount energy drawn by the customer structure from the utility company may be determined from the energy consumption data. From this information, the energy balance of the customer structure may be calculated.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of monitoring energy consumption by a customer structure, the method comprising:

providing a circuit breaker module in a single electrical panel of a customer structure that receives power from a utility company and an additional power source, the electrical panel receiving power from a main feed of the utility company to the customer structure through a utility meter of the utility company for distribution to a rest of the customer structure, the circuit breaker module including a first electrical circuit and a second electrical circuit within a housing of the circuit breaker module;

measuring energy consumed by the customer structure using the first electrical circuit within the housing of the circuit breaker module to generate energy consumption data indicative of an amount of energy consumed by the customer structure; and transmitting the energy consumption data from the second electrical circuit within the housing of the circuit breaker module to a remotely located data collection computer.

2. The method of claim 1 wherein the energy consumption data comprise electrical current values that are time stamped.

3. The method of claim 1 wherein measuring the energy consumed by the customer structure comprises:

sensing electrical current flowing through the first electrical circuit;

converting the sensed electrical current to a digital value; and storing the digital value.

4. The method of claim 3 further comprising:

time stamping the digital value; and transmitting the time stamped digital value to the data collection computer as the energy consumption data.

5. The method of claim 1 wherein the first electrical circuit comprises a transformer, an analog to digital converter, and an analysis and control circuit.

6. The method of claim 1 wherein the second electrical circuit comprises a power line modem.

7. The method of claim 1 wherein the second electrical circuit comprises a wireless data link.

8. The method of claim 1 further comprising:

determining an energy balance of the customer structure.

9. The method of claim 8 wherein the additional power source comprises a solar cell module, and wherein determining the energy balance of the customer structure comprises:
  comparing an amount of energy drawn by the customer structure from the solar cell module against an amount of energy drawn by the customer structure from the utility company using the energy consumption data transmitted from the circuit breaker module.

10. A method of monitoring energy consumption by a customer structure, the method comprising:
  installing a circuit breaker module in a single electrical panel of a customer structure that receives power from a utility company through a utility meter of the utility company and from a solar cell module, the electrical panel receiving power from a main feed of the utility company to the customer structure for distribution to a rest of the customer structure;
  using the circuit breaker module to monitor electrical current drawn by the customer structure from the utility company to generate an electrical current value; and
  transmitting the electrical current value from the circuit breaker module to a remotely located data collection computer.

11. The method of claim 10 wherein the circuit breaker module replaces an existing circuit breaker in the electrical panel.

12. The method of claim 10 wherein the circuit breaker module transmits the electrical current value over AC power lines coupling the circuit breaker module and the data collection computer.

13. The method of claim 10 wherein the circuit breaker module transmits the electrical current value to the data collection computer along with a corresponding time stamp.

14. The method of claim 10 wherein using the circuit breaker module to monitor electrical current drawn by the customer structure from the utility company to generate the electrical current value comprises:
  sensing electrical current flowing through the circuit breaker module;
  converting the sensed electrical current to a digital value; and
  storing the digital value.

15. The method of claim 10 further comprising:
  determining an energy balance of the customer structure by comparing an amount of energy drawn by the customer structure from the solar cell module against an amount of energy drawn by the customer structure from the utility company based at least on electrical current values transmitted from the circuit breaker module to the remotely located data collection computer.

* * * * *